(12) United States Patent
Nakamura et al.

(10) Patent No.: US 10,706,949 B2
(45) Date of Patent: Jul. 7, 2020

(54) MULTI-PORT REGISTER FILE DEVICE AND METHOD OF OPERATION IN NORMAL MODE AND TEST MODE

(71) Applicant: FUJITSU LIMITED, Kawasaki-shi, Kanagawa (JP)

(72) Inventors: Soichiro Nakamura, Kawasaki (JP); Tomohiro Tanaka, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/120,807

(22) Filed: Sep. 4, 2018

(65) Prior Publication Data

US 2019/0080781 A1 Mar. 14, 2019

(30) Foreign Application Priority Data

Sep. 12, 2017 (JP) .................................. 2017-174662

(51) Int. Cl.
*G11C 29/38* (2006.01)
*G11C 29/36* (2006.01)
(Continued)

(52) U.S. Cl.
CPC ............ *G11C 29/38* (2013.01); *G11C 7/1006* (2013.01); *G11C 7/24* (2013.01); *G11C 29/1201* (2013.01);
(Continued)

(58) Field of Classification Search
CPC ....... G11C 29/38; G11C 7/1006; G11C 29/32; G11C 29/1201; G11C 29/46; G11C 29/36; G11C 7/24
See application file for complete search history.

(56) References Cited

U.S. PATENT DOCUMENTS 5,668,817 A * 9/1997 Adham ............... G06F 11/2236
714/30
6,014,762 A * 1/2000 Sanghani ............... G11C 29/32
714/718
(Continued)

FOREIGN PATENT DOCUMENTS

JP 2007-287307 11/2007
JP 2014-182846 9/2014

OTHER PUBLICATIONS

Espacenet English abstract for Japanese Patent Publication No. 2007-287307, published Nov. 1, 2007.
(Continued)

*Primary Examiner* — Mushfique Siddique
(74) *Attorney, Agent, or Firm* — Staas & Halsey LLP

(57) ABSTRACT

A storage device includes: a first disabling unit configured to output write enable signals without change when at least two write addresses of a plurality of write addresses for which write enable signals are enabled and held by a first holding unit do not match; a second holding unit configured to hold sets of the plurality of write addresses held by the first holding unit and the plurality of write enable signals output by the first disabling unit; a second disabling unit configured to output one write enable signal of the plurality of write enable signals held by the second holding unit without change in a test mode; and a third holding unit configured to write data in accordance with sets of the plurality of write addresses held by the second holding unit and the plurality of write addresses output by the second disabling unit.

10 Claims, 12 Drawing Sheets

(51) Int. Cl.
*G11C 7/24* (2006.01)
*G11C 7/10* (2006.01)
*G11C 29/32* (2006.01)
*G11C 29/12* (2006.01)
*G11C 29/46* (2006.01)
*G11C 29/14* (2006.01)

(52) U.S. Cl.
CPC .............. *G11C 29/32* (2013.01); *G11C 29/36* (2013.01); *G11C 29/46* (2013.01); *G11C 7/1075* (2013.01); *G11C 29/14* (2013.01); *G11C 2029/3202* (2013.01); *G11C 2207/007* (2013.01)

(56) References Cited

U.S. PATENT DOCUMENTS

| | | | | |
|---|---|---|---|---|
| 6,055,649 A | * | 4/2000 | Deao | G06F 11/2236 714/30 |
| 9,892,802 B1 | * | 2/2018 | Yang | G11C 29/10 |
| 2002/0194546 A1 | * | 12/2002 | Ooishi | G11C 29/12015 714/42 |
| 2007/0234120 A1 | * | 10/2007 | Yoshida | G11C 29/26 714/30 |
| 2007/0245093 A1 | * | 10/2007 | Do | G11C 7/1075 711/149 |
| 2011/0060952 A1 | * | 3/2011 | Asai | G11C 29/50 714/718 |
| 2013/0258786 A1 | * | 10/2013 | Chakravarty | G11C 7/1075 365/189.02 |
| 2014/0281285 A1 | * | 9/2014 | Tanaka | G11C 7/1075 711/149 |
| 2015/0279484 A1 | * | 10/2015 | Kuroda | G11C 29/1201 365/201 |

OTHER PUBLICATIONS

Espacenet English abstract for Japanese Patent Publication No. 2014-182846, published Sep. 29, 2014.

* cited by examiner

| TM | TMWM[1] | TMWM[0] | WE3_A | WE3_B | WE3_C |
|----|---------|---------|-------|-------|-------|
| 1  | *       | *       | WE2_A | WE2_B | WE2_C |
| 0  | 0       | 0       | WE2_A | 0     | 0     |
| 0  | 0       | 1       | 0     | WE2_B | 0     |
| 0  | 1       | 0       | 0     | 0     | WE2_C |
| 0  | 1       | 1       | 0     | 0     | 0     |

FIG.12

| TM | TMWM[2] | TMWM[1] | TMWM[0] | WE3_A | WE3_B | WE3_C | WE3_D | WE3_E |
|---|---|---|---|---|---|---|---|---|
| 1 | * | * | * | WE2_A | WE2_B | WE2_C | WE2_D | WE2_E |
| 0 | 0 | 0 | 0 | WE2_A | 0 | 0 | 0 | 0 |
| 0 | 0 | 0 | 1 | 0 | WE2_B | 0 | 0 | 0 |
| 0 | 0 | 1 | 0 | 0 | 0 | WE2_C | 0 | 0 |
| 0 | 0 | 1 | 1 | 0 | 0 | 0 | WE2_D | 0 |
| 0 | 1 | * | * | 0 | 0 | 0 | 0 | WE2_E | ns that are input from a plurality of pads
MULTI-PORT REGISTER FILE DEVICE AND METHOD OF OPERATION IN NORMAL MODE AND TEST MODE

CROSS-REFERENCE TO RELATED APPLICATION

This application is based upon and claims the benefit of priority of the prior Japanese Patent Application No. 2017-174662 filed on Sep. 12, 2017, the entire contents of which are incorporated herein by reference.

FIELD

The embodiments discussed herein relate to a storage device, an operation processing device, and a control method of a storage device.

BACKGROUND

Patent Document 1 describes a multi-port memory device that includes a plurality of ports for supporting external devices and serial input/output interfaces; and a plurality of banks for transmitting/receiving data in parallel with the ports. In the multi-port memory device, a plurality of global data buses support transmission/reception of data between the ports and the banks. In the multi-port memory device, during a test mode for testing a core area of the banks, a test input/output controller transmits, to the banks via the global data buses without passing through the ports, a test signal and a test input signal that are input from a plurality of pads to the ports. In response to the test signal, the test input/output controller transmits, to the pads via the global data buses, a test output signal output from the banks.

Further, Patent Document 2 describes a register file device including a data storage unit including a multi-port latch; and a writing unit that generates, from a clock signal and a plurality of sets of write control signals, write addresses, and write data, a write signal to be written to the data storage unit. The writing unit includes an address matching detecting circuit and a changing circuit. The address matching detecting circuit detects that at least two addresses of the plurality of write addresses match, and outputs an address matching signal for the matched addresses. Upon the address matching signal being output, the changing circuit changes write data of the matched addresses to same data.

RELATED-ART DOCUMENTS

Patent Documents

[Patent Document 1] Japanese Laid-open Patent Publication No. 2007-287307
[Patent Document 2] Japanese Laid-open Patent Publication No. 2014-182846

Patent Document 2 enables to prevent a process of simultaneously writing different data to the same address. However, Patent Document 2 does not disclose a method for testing a register file device. When the register file device is tested, there is a possibility that a process of simultaneously writing different data to the same address is performed.

SUMMARY

According to an aspect of the embodiments, a storage device includes: a first holding unit configured to hold a plurality of sets of write addresses and write enable signals; a first disabling unit configured to output the write enable signals without change when at least two write addresses of a plurality of write addresses for which write enable signals are enabled and held by the first holding unit do not match; a second holding unit configured to hold sets of the plurality of write addresses held by the first holding unit and the plurality of write enable signals output by the first disabling unit; a second disabling unit configured to output one write enable signal of the plurality of write enable signals held by the second holding unit without change and disable other write enable signals of the plurality of write enable signals held by the second holding unit to output the disabled signals or configured to disable all the write enable signals to output the disabled signals in a test mode, the second disabling unit being configured to output the plurality of write enable signals held by the second holding unit without change in a normal mode; and a third holding unit configured to write, in accordance with sets of the plurality of write addresses held by the second holding unit and the plurality of write addresses output by the second disabling unit, write data, wherein, in the test mode, the first holding unit and the second holding unit are mutually connected and test data is written in the first holding unit and the second holding unit.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 12 is a diagram illustrating a truth table of input/output of a write disabling unit.

DESCRIPTION OF EMBODIMENT

First Embodiment

Figure 1:
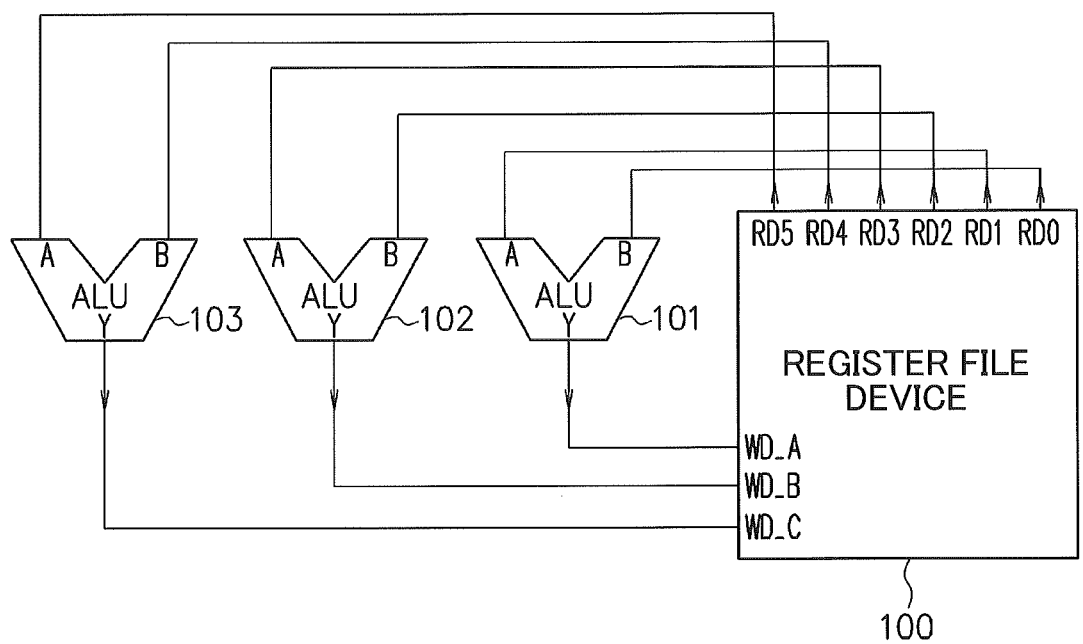
FIG. 1 is a diagram illustrating a configuration example of an operation processing device according to a first embodiment.

FIG. 1 is a diagram illustrating a configuration example of an operation processing device according to a first embodiment. The operation processing device is a processor, and includes a register file device 100 and three arithmetic and logic units (ALUs) 101 to 103. The register file device 100 is a storage device, and stores respective data in a plurality of addresses. The ALUs 101 to 103 are operation units, are connected to the register file device 100, and perform arithmetic and logic operations of data in parallel for speeding up. The register file device 100 can read respective data RD0 to RD5 of six read addresses, for example. The ALU 101 receives the data RD0 and RD1, performs an operation, and outputs data WD_A. The ALU 102 receives the data RD2 and RD3, performs an operation, and outputs data WD_B. The ALU 103 receives the data RD4 and RD5, performs an operation, and outputs data WD_C. The register file device 100 can write the data WD_A, WD_B, and WD_C. Here, it is required for the register file device 100 to prohibit a process of simultaneously writing different data to a same address.

Figure 2:
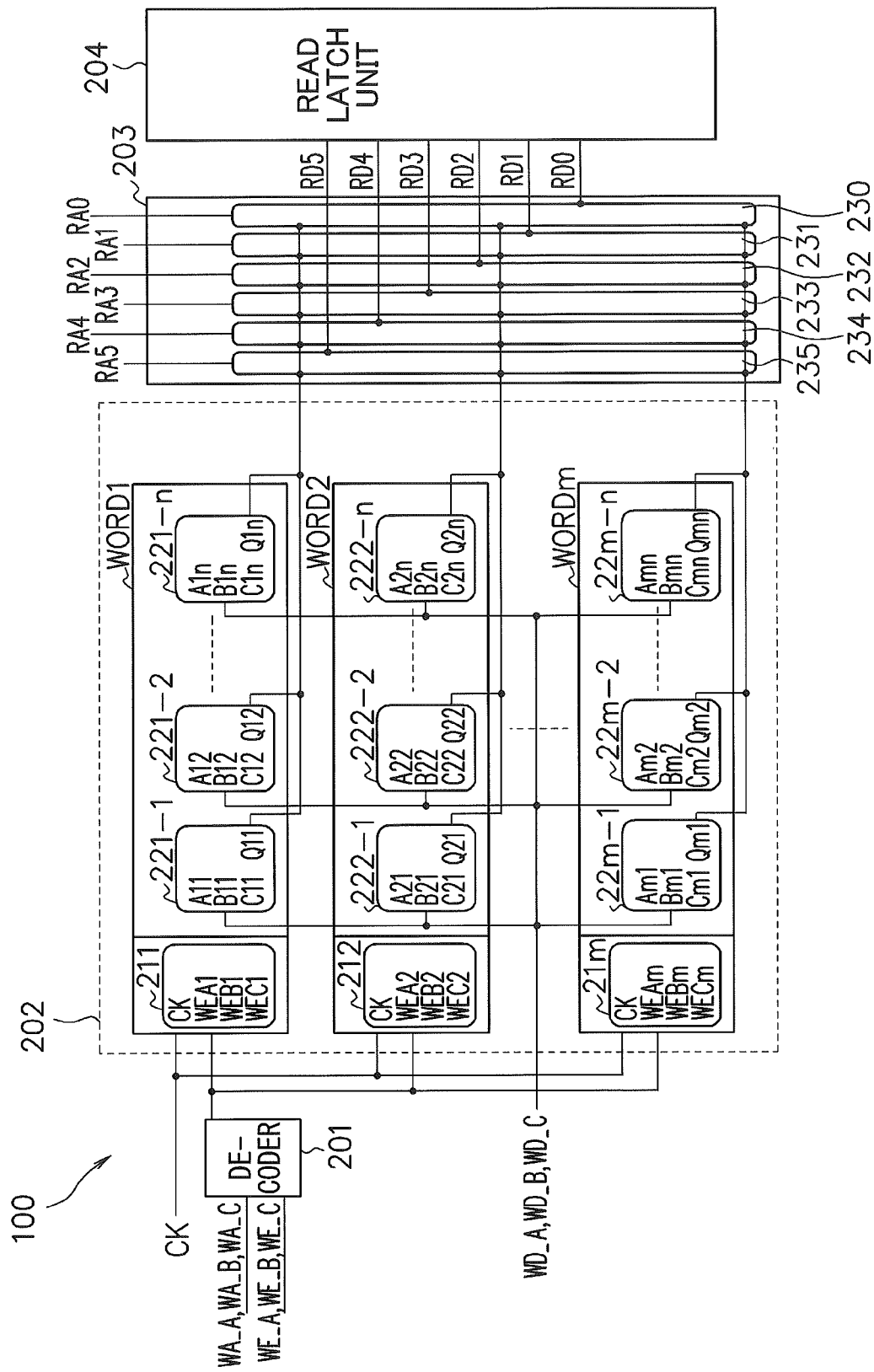
FIG. 2 is a diagram illustrating a basic configuration example of a register file device.

FIG. 2 is a diagram illustrating a basic configuration example of the register file device 100. The register file device 100 includes a decoder 201, a holding unit 202, a reading unit 203, and a read latch unit 204. When a write enable signal WE_A is in an enabled state, the register file device 100 writes the write data WD_A in a write address WA_A. Also, when a write enable signal WE_B is in an enabled state, the register file device 100 writes the write data WD_B in a write address WA_B. Also, when a write enable signal WE_C is in an enabled state, the register file device 100 writes the write data WD_C in a write address WA_C. Each of the write data WD_A, WD_B and WD_C is n-bit (one word) data.

The decoder 201 receives a combination of the write address WA_A and the write enable signal WE_A, a combination of the write address WA_B and the write enable signal WE_B, and a combination of the write address WA_C and the write enable signal WE_C, and outputs write enable signals WEA1 to WEAm, WEB1 to WEBm, and WEC1 to WECm.

First, a case in which the write enable signal WE_A is in the enabled state will be described. In that case, when the write address WA_A is the first address, the write enable signal WEA1 becomes in the enabled state. When the write address WA_A is the second address, the write enable signal WEA2 becomes in the enabled state. When the write address WA_A is the m-th address, the write enable signal WEAm becomes in the enabled state.

Next, a case in the write enable signal WE_B is in the enabled state will be described. In that case, when the write address WA_B is the first address, the write enable signal WEB1 becomes in the enabled state. When the write address WA_B is the second address, the write enable signal WEB2 becomes in the enabled state. When the write address WA_B is the m-th address, the write enable signal WEBm becomes in the enabled state.

Next, a case in the write enable signal WE_C is in the enabled state will be described. In that case, when the write address WA_C is the first address, the write enable signal WEC1 becomes in the enabled state. When the write address WA_C is the second address, the write enable signal WEC2 becomes in the enabled state. When the write address WA_C is the m-th address, the write enable signal WECm becomes in the enabled state.

The holding unit 202 includes m three-port latch units WORD1 to WORDm. The three-port latch unit WORD1 includes a writing unit 211 and n latch units 221-1 to 221-$n$, and stores n-bit (one word) data of the first address. The writing unit 211 controls writing to the n latch units 221-1 to 221-$n$ by using the clock signal CK. Specifically, when the write enable signal WEA1 is in the enabled state, the writing unit 211 writes n-bit write data WD_A (A11 to A1$n$) to the n latch units 221-1 to 221-$n$. Also, when the write enable signal WEB1 is in the enabled state, the writing unit 211 writes n-bit write data WD_B (B11 to B1$n$) to the n latch units 221-1 to 221-$n$. Also, when the write enable signal WEC1 is in the enabled state, the writing unit 211 writes n-bit write data WD_C (C11 to C1$n$) to the n latch units 221-1 to 221-$n$.

The three-port latch unit WORD2 includes a writing unit 212 and n latch units 222-1 to 222-$n$, and stores n-bit (one word) data of the second address. The writing unit 212 controls writing to the n latch units 222-1 to 222-$n$ by using the clock signal CK. Specifically, when the write enable signal WEA2 is in the enabled state, the writing unit 212 writes n-bit write data WD_A (A21 to A2$n$) to the n latch units 222-1 to 222-$n$. Also, when the write enable signal WEB2 is in the enabled state, the writing unit 212 writes n-bit write data WD_B (B21 to B2$n$) to the n latch units 222-1 to 222-$n$. Also, when the write enable signal WEC2 is in the enabled state, the writing unit 212 writes n-bit write data WD_C (C21 to C2$n$) to the n latch units 222-1 to 222-$n$.

The three-port latch unit WORDm includes a writing unit 21$m$ and n latch units 22$m$-1 to 22$m$-$n$, and stores n-bit (one word) data of the m-th address. The writing unit 21$m$ controls writing to the n latch units 22$m$-1 to 22$m$-$n$ by using the clock signal CK.

The reading unit 203 includes selectors 230 to 235. In accordance with a read address RA0, the selector 230 reads data stored in one of the three-port latch units WORD1 to WORDm and outputs the read data as data RD0. For example, when the read address RA0 is the first address, the selector 230 outputs, as the data RD0, n-bit data Q11 to Q1$n$ stored in the latch units 221-1 to 221-$n$. Also, when the read address RA0 is the second address, the selector 230 outputs, as the data RD0, n-bit data Q21 to Q2$n$ stored in the latch units 222-1 to 222-$n$.

Similarly, in accordance with a read address RA1, the selector 231 reads data stored in one of the three-port latch units WORD1 to WORDm and outputs the read data as data RD1. In accordance with a read address RA2, the selector 232 reads data stored in one of the three-port latch units WORD1 to WORDm and outputs the read data as data RD2. In accordance with a read address RA3, the selector 233 reads data stored in one of the three-port latch units WORD1 to WORDm and outputs the read data as data RD3. In accordance with a read address RA4, the selector 234 reads data stored in one of the three-port latch units WORD1 to WORDm and outputs the read data as data RD4. In accordance with a read address RA5, the selector 235 reads data stored in one of the three-port latch units WORD1 to WORDm and outputs the read data as data RD5. The read latch unit 204 is a holding unit, and holds the data RD0 to RD5.

Figure 3:
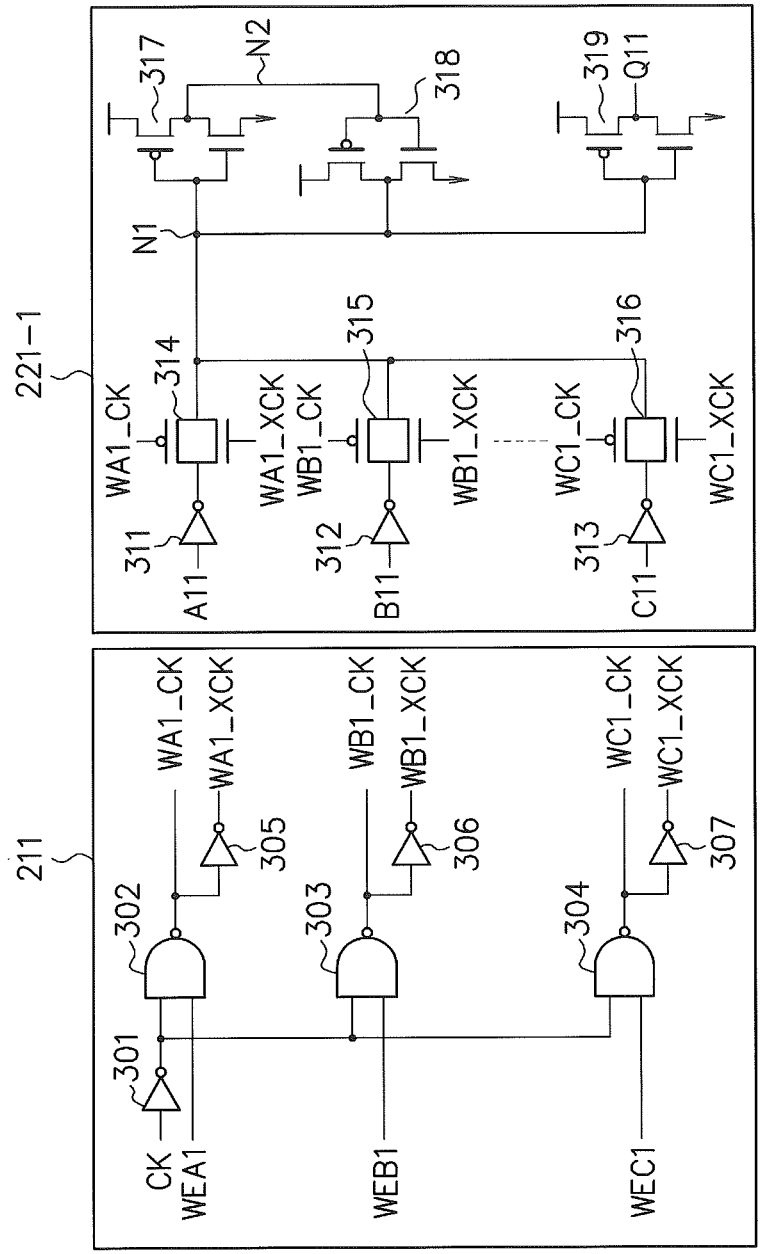
FIG. 3 is a circuit diagram illustrating a configuration example of a writing unit and a latch unit.

FIG. 3 is a circuit diagram illustrating a configuration example of the writing unit 211 and the latch unit 221-1 in FIG. 2. Each of the writing units 212 to 21$m$ in FIG. 2 has a configuration similar to that of the writing unit 211. Each of the latch units 221-2 to 221-$n$, 222-1 to 222-$n$, and 22$m$-1 to 22$m$-$n$ in FIG. 2 has a configuration similar to that of the latch unit 221-1.

The writing unit 211 includes inverters 301 and 305 to 307 and NAND circuits 302 to 304. The inverter 301 outputs a signal obtained by logically inverting the clock signal CK. The NAND circuit 302 outputs, as a clock signal WA1_CK, a NAND signal of the output signal of the inverter 301 and the write enable signal WEA1. The inverter 305 outputs, as a clock signal WA1_XCK, a signal obtained by logically inverting the clock signal WA1_CK. The NAND circuit 303 outputs, as a clock signal WB1_CK, a NAND signal of the output signal of the inverter 301 and the write enable signal WEB1. The inverter 306 outputs, as a clock signal WB1_XCK, a signal obtained by logically inverting the clock signal WB1_CK. The NAND circuit 304 outputs, as a clock signal WC1_CK, a NAND signal of the output signal of the inverter 301 and the write enable signal WEC1. The inverter 307 outputs, as a clock signal WC1_XCK, a signal obtained by logically inverting the clock signal WC1_CK.

The latch unit 221-1 includes inverters 311 to 313, transfer gates 314 to 316, and inverters 317 to 319. The inverter 311 outputs data obtained by logically inverting write data A11. The transfer gate 314 includes a p-channel field effect transistor and an n-channel field effect transistor. When the clock signal WA1_CK is at the low level, the transfer gate 314 connects the output terminal of the inverter 311 to the node N1, and when the clock signal WA1_CK is at the high level, the transfer gate 314 disconnects the output terminal of the inverter 311 from the node N1.

The inverter 312 outputs data obtained by logically inverting write data B11. The transfer gate 315 includes a p-channel field effect transistor and an n-channel field effect transistor. When the clock signal WB1_CK is at the low level, the transfer gate 315 connects the output terminal of the inverter 312 to the node N1, and when the clock signal WB1_CK is at the high level, the transfer gate 315 disconnects the output terminal of the inverter 312 from the node N1.

The inverter 313 outputs data obtained by logically inverting write data C11. The transfer gate 316 includes a p-channel field effect transistor and an n-channel field effect transistor. When the clock signal WC1_CK is at the low level, the transfer gate 316 connects the output terminal of the inverter 313 to the node N1, and when the clock signal WC1_CK is at the high level, the transfer gate 316 disconnects the output terminal of the inverter 313 from the node N1.

The inverter 317 includes a p-channel field effect transistor and an n-channel field effect transistor, and outputs, to the node N2, data obtained by logically inverting the data of the node N1. The inverter 318 includes a p-channel field effect transistor and an n-channel field effect transistor, and outputs, to the node N1, data obtained by logically inverting the data of the node N2. The inverters 317 and 318 are latch units and hold data. The inverter 319 includes a p-channel field effect transistor and an n-channel field effect transistor, and outputs, as data Q11, data obtained by logically inverting the data of the node N1.

When the write enable signal WEA1 is at the high level (in the enabled state), upon the clock signal CK becoming a negative pulse, the clock signal WA1_CK becomes at the low level and the transfer gate 314 is turned on. Then, the logically inverted data of the write data A11 is held at the node N1, and the inverter 319 outputs the write data A11 as the data Q11.

When the write enable signal WEB1 is at the high level (in the enabled state), upon the clock signal CK becoming a negative pulse, the clock signal WB1_CK becomes at the low level and the transfer gate 315 is turned on. Then, the logically inverted data of the write data B11 is held at the node N1, and the inverter 319 outputs the write data B11 as the data Q11.

When the write enable signal WEC1 is at the high level (in the enabled state), upon the clock signal CK becoming a negative pulse, the clock signal WC1_CK becomes at the low level and the transfer gate 316 is turned on. Then, the logically inverted data of the write data C11 is held at the node N1, and the inverter 319 outputs the write data C11 as the data Q11.

Here, upon two or more of the write enable signals WEA1 to WEC1 becoming at the high level, when the clock signal CK becomes at the negative pulse, there is a possibility that two or more of the transfer gates 314 to 316 are simultaneously turned on and a bus fight (short circuit) occurs at the latch units of the inverters 317 and 318. When such bus fights occur, values to be stored in latch units are not determined, and in the worst case, a large electric current flows and a semiconductor device of a latch unit is broken. In the following, a register file device 100A for preventing a bus fight will be described with reference to FIG. 4.

Figure 4:
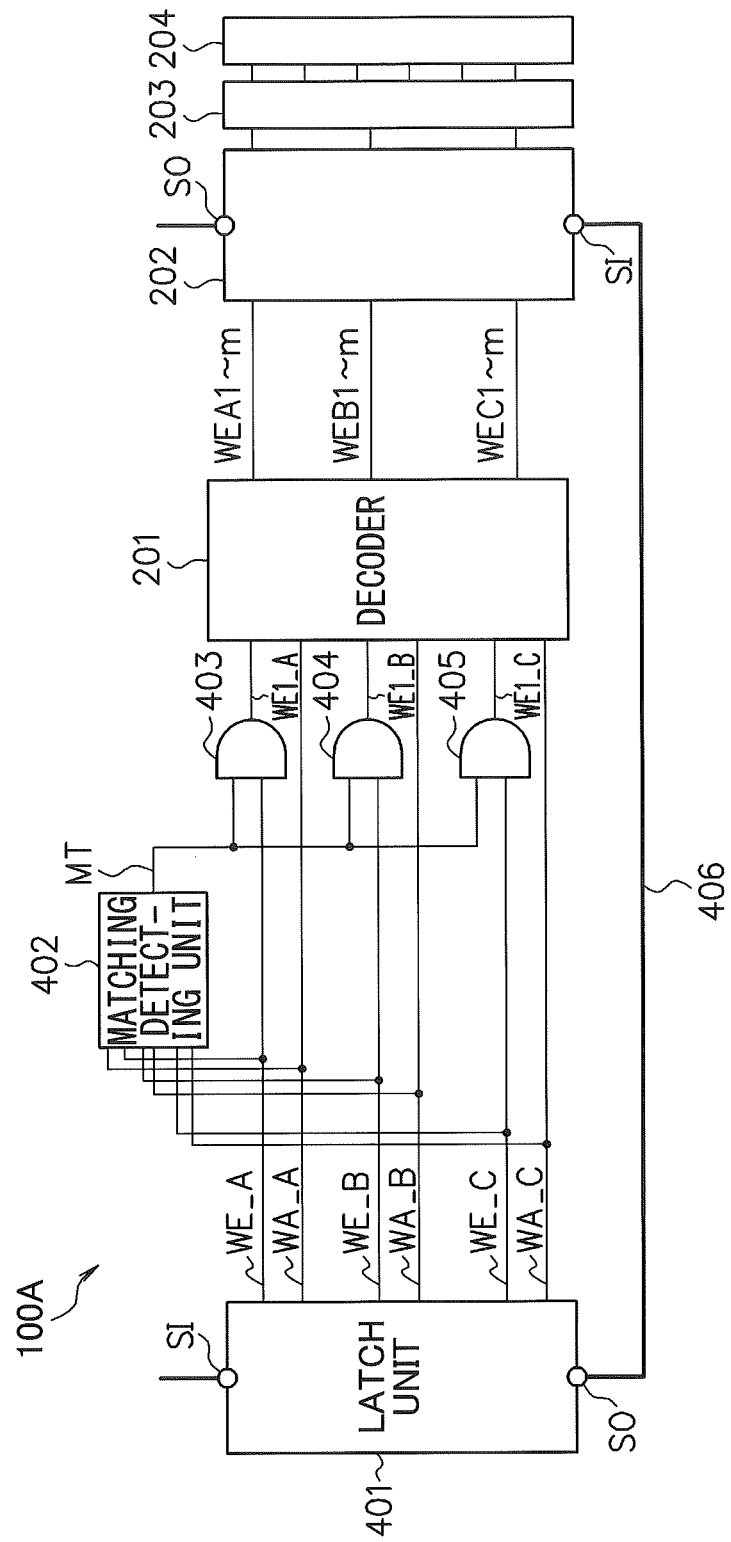
FIG. 4 is a diagram illustrating a configuration example of a register file device according to a first basic technique.

FIG. 4 is a diagram illustrating a configuration example of the register file device 100A according to a first basic technique. The register file device 100A of FIG. 4 is obtained by adding, to the register file device 100 of FIG. 2, a latch unit 401, a matching detecting unit 402, AND circuits 403 to 405, and a scan path 406. The register file device 100A has a normal mode and a test mode.

First, the normal mode will be described. In the normal mode, the latch unit 401 and the holding unit 202 are disconnected from the scan path 406. The latch unit 401 is a holding unit, and holds write enable signals WE_A to WE_C and write addresses WA_A to WA_C, and outputs the write enable signals WE_A to WE_C and the write addresses WA_A to WA_C.

The matching detecting unit 402 receives the write enable signals WE_A to WE_C and the write addresses WA_A to WA_C and outputs a mismatch signal MT. The AND circuit 403 outputs a logical conjunction signal of the write enable signal WE_A and the mismatch signal MT as a write enable signal WE1_A. The AND circuit 404 outputs a logical conjunction signal of the write enable signal WE_B and the mismatch signal MT as a write enable signal WE1_B. The AND circuit 405 outputs a logical conjunction signal of the write enable signal WE_C and the mismatch signal MT as a write enable signal WE1_C. Similarly to the case of FIG. 2, the decoder 201 outputs the write enable signals WEA1 to WEAm, WEB1 to WEBm, and WEC1 to WECm based on the write enable signals WE1_A to WE1_C and the write addresses WA_A to WA_C.

When the write enable signals WE_A and WE_B are at the high level (in the enabled state) and the write addresses WA_A and WA_B are the same, the matching detecting unit 402 outputs the mismatch signal MT at the low level. In this case, the AND circuits 403 to 405 respectively output the write enable signals WE1_A to WE1_C at the low level (in the disabled state).

Also, when the write enable signals WE_B and WE_C are at the high level and the write addresses WA_B and WA_C are the same, the matching detecting unit 402 outputs the mismatch signal MT at the low level. In this case, the AND circuits 403 to 405 respectively output the write enable signals WE1_A to WE1_C at the low level.

Also, when the write enable signals WE_A and WE_C are at the high level and the write addresses WA_A and WA_C are the same, the matching detecting unit 402 outputs the mismatch signal MT at the low level. In this case, the AND circuits 403 to 405 respectively output the write enable signals WE1_A to WE1_C at the low level.

Also, when the write enable signals WE_A, WE_B, and WE_C are at the high level and the write addresses WA_A, WA_B and WA_C are the same, the matching detecting unit 402 outputs the mismatch signal MT at low level. In this case, the AND circuits 403 to 405 respectively output the write enable signals WE1_A to WE1_C at the low level.

Also, the matching detecting unit 402 outputs the mismatch signal MT at the high level in cases other than the above. When the matching detecting unit 402 outputs the high-level mismatch signal MT, the AND circuit 403 outputs the write enable signal WE_A as the write enable signal WE1_A. The AND circuit 404 outputs the write enable signal WE_B as the write enable signal WE1_B. The AND circuit 405 outputs the write enable signal WE_C as the write enable signal WE1_C.

As described above, when the matching detecting unit 402 outputs the low-level mismatch signal MT, the write enable signals WE1_A to WE1_C all become at the low level. Thereby, a bus fight can be prevented.

As in the case of FIG. 2, the holding unit 202 writes, in accordance with the write enable signals WEA1 to WEAm, WEB1 to WEBm, and WEC1 to WECm, write data, and holds the write data. The operations of the reading unit 203 and the read latch unit 204 are similar to those in the case of FIG. 2.

Next, the test mode will be described. In the test mode, a scan test is performed. The latch unit 401 includes a scan input terminal SI and a scan output terminal SO for the scan test. The holding unit 202 includes a scan input terminal SI and a scan output terminal SO for the scan test. In the test mode, the scan output terminal SO of the latch unit 401 is connected to the scan input terminal SI of the holding unit 202 via the scan path 406. By inputting test data to the scan input terminal SI of the latch unit 401 and causing the latch unit 401 and the latch unit of the holding unit 202 to perform a shift operation, the test data is written in the latch unit 401 and the latch unit of the holding unit 202. Thereafter, the register file device 100A performs one cycle of operation based on the test data. Then, data based on the test data is held in the holding unit 202. Next, by causing the latch unit 401 and the latch unit of the holding unit 202 to perform a shift operation, the data of the latch unit of the holding unit 202 is read out from the scan output terminal SO of the holding unit 202. By comparing the read data with an expected value, it is possible to determine the test result of the register file device 100A.

Here, one cycle of the register file device 100A is a duration from when the latch unit 401 outputs the write enable signals WE_A to WE_C and the write addresses WA_A to WA_C to when the latch unit of the holding unit 202 holds the data. The duration of this one cycle is relatively long because of including the operation durations of the matching detecting unit 402, the AND circuits 403 to 405, and the decoder 201. When the duration of one cycle is long, it is difficult to increase the frequency of a clock signal of the register file device 100A. In the following, a register file device 100B for shortening the duration of one cycle will be described with reference to FIG. 5.

Figure 5:
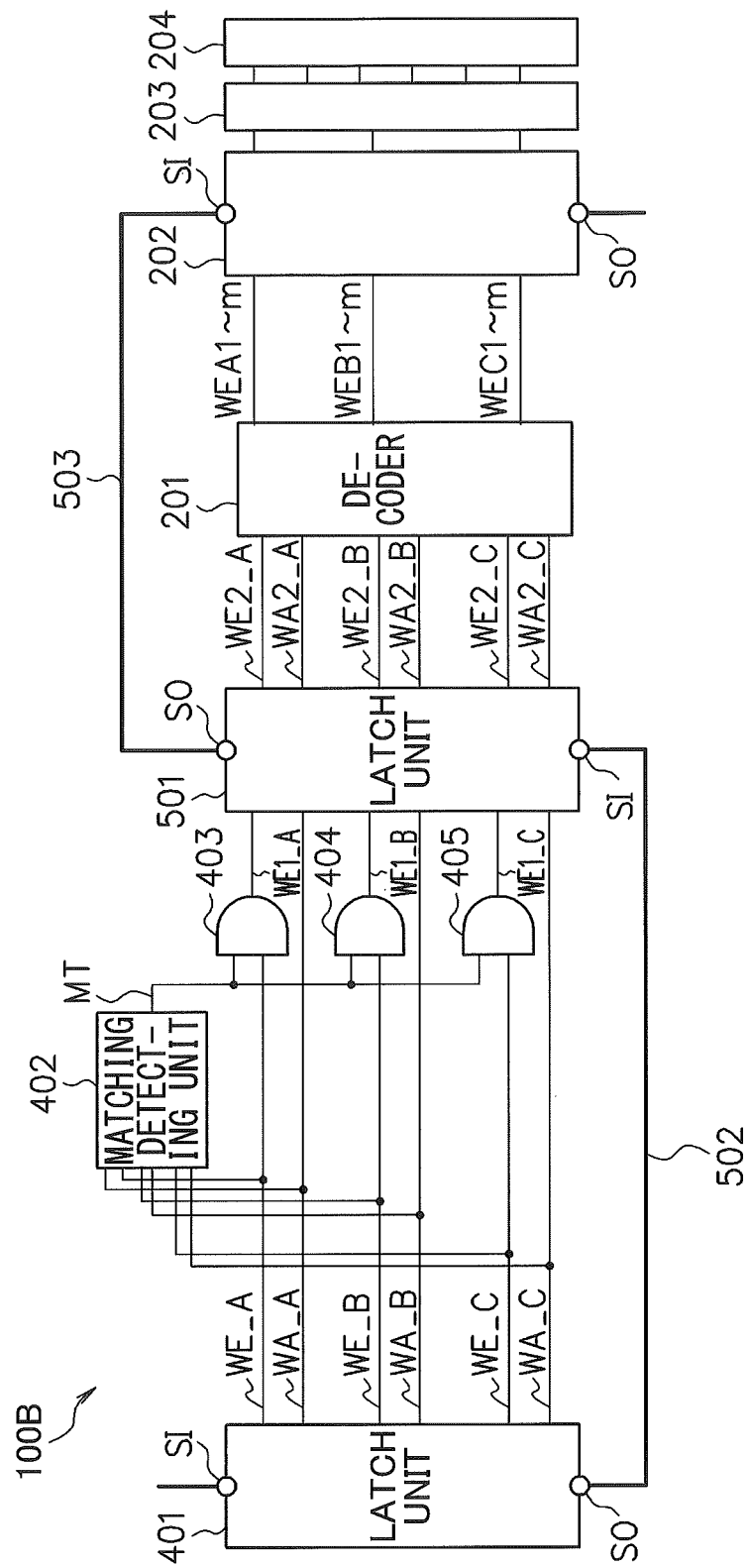
FIG. 5 is a diagram illustrating a configuration example of a register file device according to a second basic technique.

FIG. 5 is a diagram illustrating a configuration example of the register file device 100B according to a second basic technique. The register file device 100B of FIG. 5 is obtained by adding, to the register file device 100A of FIG. 4, a latch unit 501.

First, a normal mode will be described. In the normal mode, the latch unit 401, the latch unit 501, and the holding unit 202 are disconnected from the scan paths 502 and 503. In the first cycle, the latch unit 401 outputs the write enable signals WE_A to WE_C and the write addresses WA_A to WA_C. The latch unit 501 is a holding unit and holds the write enable signals WE1_A to WE1_C and the write addresses WA_A to WA_C. Next, in the second cycle, the latch unit 501 outputs the held write enable signals and the held write addresses as write enable signals WE2_A to WE2_C and write addresses WA2_A to WA2_C. The holding unit 202 holds data based on the write enable signals WEA1 to WEAm, WEB1 to WEBm, and WEC1 to WECm.

As described above, by providing the latch unit 501, the duration of the first cycle from the output of the latch unit 401 to the input of the latch unit 501 is shortened, and the duration of the second cycle from the output of the latch unit 501 to the input of the holding unit 202 is also shortened. Thereby, because the duration of one cycle is shortened, the frequency of the register file device 100B can be increased, and the operation of the register file device 100B can be speeded up.

Next, a test mode will be described. In the scan mode, a scan test is performed. The latch unit 501 includes a scan input terminal SI and a scan output terminal SO for the scan test. In the test mode, the scan output terminal SO of the latch unit 401 is connected to the scan input terminal SI of the latch unit 501 via the scan path 502. The scan output terminal SO of the latch unit 501 is connected to the scan input terminal SI of the holding unit 202 via the scan path 503. By inputting test data to the scan input terminal SI of the latch unit 401 and causing the latch unit 401, the latch unit 501, and the latch unit of the holding unit 202 to perform a shift operation, the test data is written in the latch unit 401, the latch unit 501, and the latch unit of the holding unit 202. Thereafter, the register file device 100B performs one cycle of operation based on the test data. Then, data based on the test data is held in the latch unit 501 and the holding unit 202. Next, by causing the latch unit 401, the latch unit 501, and the latch unit of the holding unit 202 to perform a shift operation, the data of latch unit 501 and the latch unit of the holding unit 202 is read out from the scan output terminal SO of the holding unit 202. By comparing the read data with an expected value, it is possible to determine the test result of the register file device 100B.

Here, desired test data can be written in the latch unit 501. Therefore, in the test mode, a bus fight may occur. Also, when generating test data that does not cause a bus fight, there is a problem that the number of patterns of test data increases and the amount of time for test increases. In the following, with reference to FIG. 6, a register file device 100C that can prevent a bus fight not only in a normal mode but also in a test mode will be described.

Figure 6:
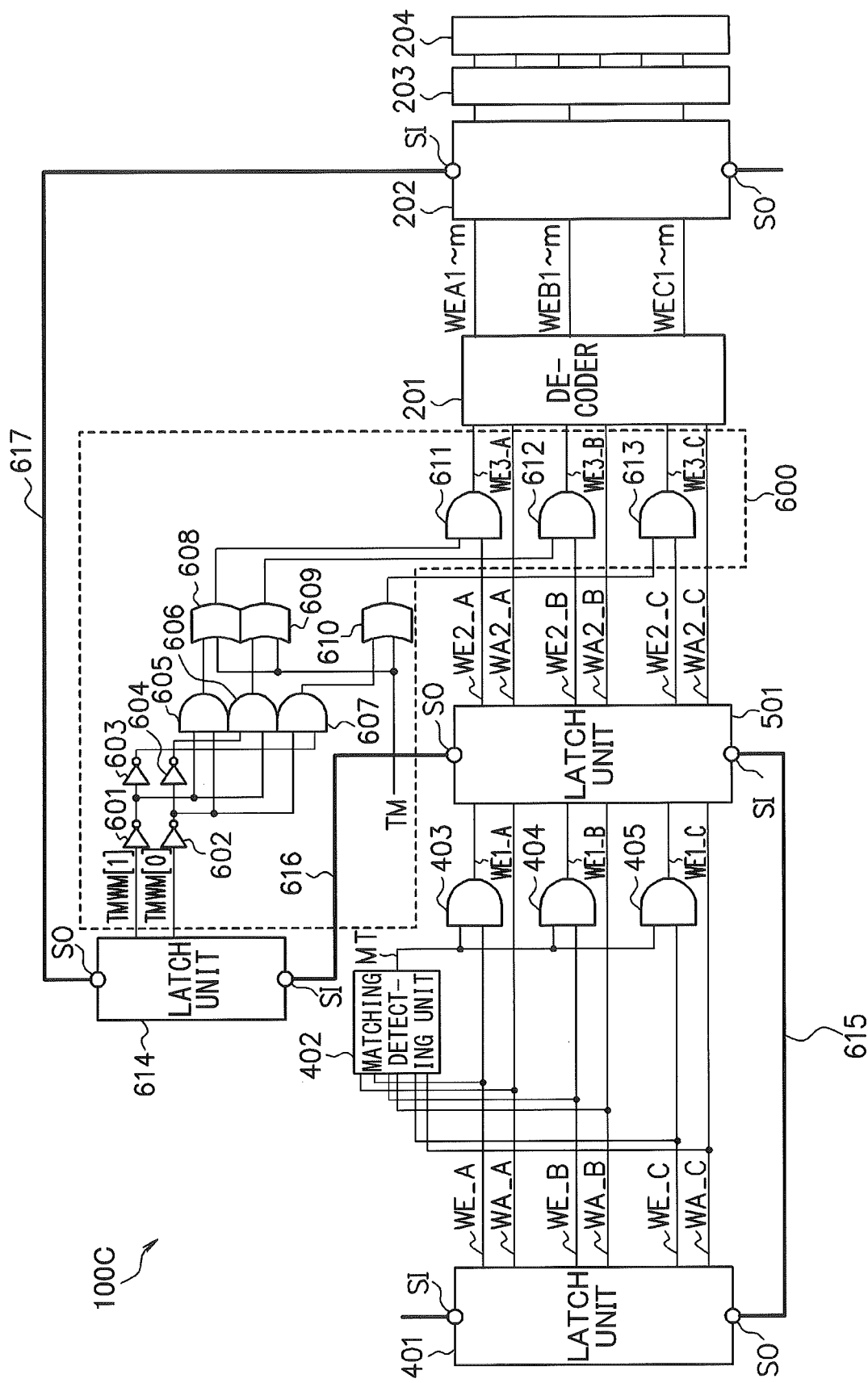
FIG. 6 is a diagram illustrating a configuration example of a register file device according to the first embodiment

FIG. 6 is a diagram illustrating a configuration example of the register file device 100C according to the first embodiment. The register file device 100C of FIG. 6 is obtained by adding, to the register file device 100B of FIG. 5, a write disabling unit 600 and a latch unit 614. The register file device 100C of FIG. 6 includes the decoder 201, the holding unit 202, the reading unit 203, and the read latch unit 204, similarly to the register file device 100 of FIG. 2. Further, similarly to the register file device 100B of FIG. 5, the register file device 100C of FIG. 6 includes the latch unit 401, the matching detecting unit 402, the AND circuits 403 to 405, and the latch unit 501. Further, the register file device 100C of FIG. 6 includes the write disabling unit and the latch unit 614, and has a normal mode and a test mode.

Figures 7, 8:
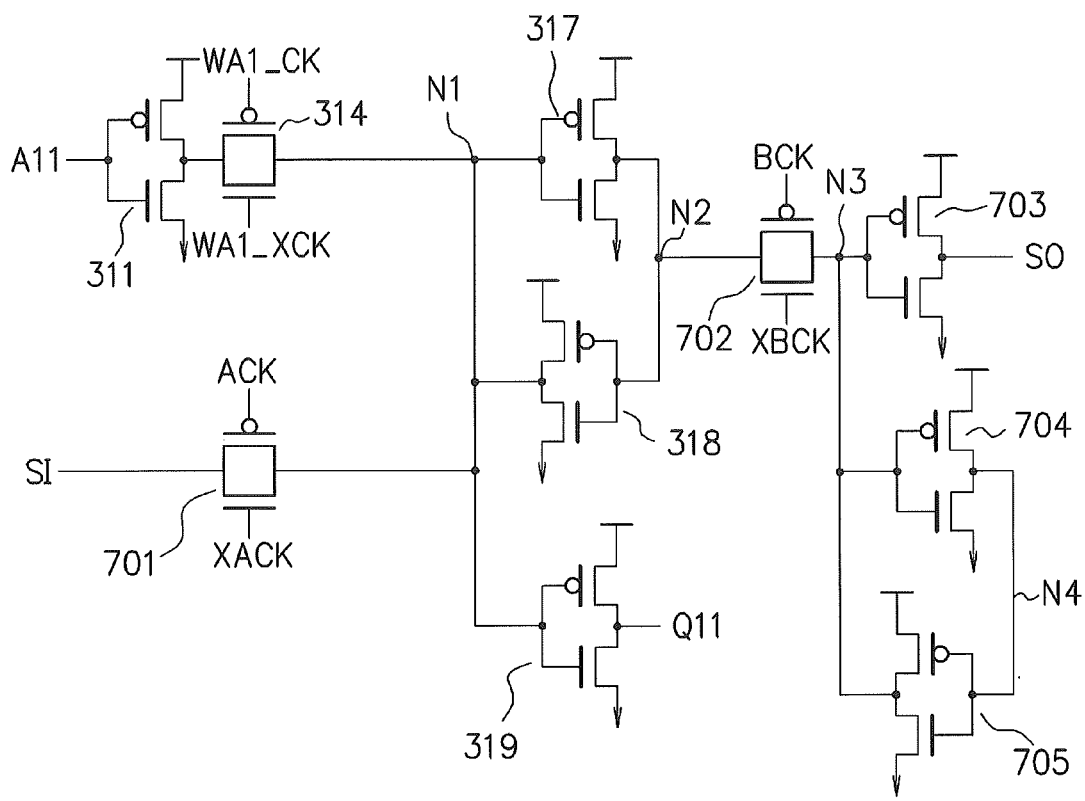
FIG. 7 is a diagram illustrating a configuration example of the latch unit.
FIG. 8 is a diagram illustrating a truth table of input/output of a write disabling unit.

FIG. 7 is a diagram illustrating a configuration example of the latch unit 221-1 of the holding unit 202. The latch unit 221-1 in FIG. 7 is provided instead of the latch unit 221-1 in FIG. 3. Each of the latch units 221-2 to 221-n, 222-1 to 222-n, 22m-1 to 22m-n in FIG. 2 has a configuration similar to that of the latch unit 221-1. The latch unit 221-1 of FIG. 7 is obtained by adding transfer gates 701 and 702 and inverters 703 to 705 to the latch unit 221-1 of FIG. 3. Note that the latch circuit 221-1 in FIG. 7 includes inverters 312 and 313 and transfer gates 315 and 316 similarly to the latch circuit 221-1 in FIG. 3.

The transfer gate 701 includes a p-channel field effect transistor and an n-channel field effect transistor, and connects, in accordance with a test clock signal ACK, the scan input terminal SI to the node N1. The transfer gate 702 includes a p-channel field effect transistor and an n-channel field effect transistor, and connects, in accordance with a test clock signal BCK, the node N2 to the node N3.

The inverter 704 includes a p-channel field effect transistor and an n-channel field effect transistor, and outputs, to the node N4, data obtained by logically inverting data of the node N3. The inverter 705 includes a p-channel field effect transistor and an n-channel field effect transistor, and outputs, to the node N3, data obtained by logically inverting data of the node N4. Inverters 704 and 705 are latch units and hold data. The inverter 703 includes a p-channel field effect transistor and an n-channel field effect transistor, and outputs, to the scan output terminal SO, data obtained by logically inverting data of the node N3.

In the normal mode, the transfer gates 701 and 702 are turned off, and the latch unit 221-1 in FIG. 7 operates similarly to the latch unit 221-1 in FIG. 3. In the test mode, the transfer gates 314 to 316 (in FIG. 3) are turned off and the transfer gate 701 is turned on, whereby test data of the scan input terminal SI is held at the nodes N1 and N2. In the test mode, thereafter, by turning on the transfer gate 702, data obtained by logically inverting data of the node N2 is output to the scan output terminal SO.

Note that each of the latch units 401, 501 and 614 in FIG. 6 has a configuration similar to that of the latch unit 221-1 in FIG. 7. However, the latch units 401, 501 and 614 do not have inverters 312, 313 and transfer gates 315 and 316 of FIG. 3. The scan output terminal SO of the latch unit 401 is connected to the scan input terminal SI of the latch unit 501 via the scan path 615. The scan output terminal SO of the latch unit 501 is connected to the scan input terminal SI of the latch unit 614 via the scan path 616. The scan output terminal SO of the latch unit 614 is connected to the scan input terminal SI of the latch unit 221-1 in the holding unit 202 via the scan path 617. The plurality of latch units 221-1 to 22m-n in the holding unit 202 are connected in series through the scan terminals SI and SO.

First, the normal mode will be described. The latch unit 401 is a holding unit, and holds a plurality of combinations of write addresses WA_A to WA_C and write enable signals WE_A to WE_C. Similarly to the above, the matching detecting unit 402 outputs a mismatch signal MT based on the write enable signals WE_A to WE_C and the write addresses WA_A to WA_C. The AND circuit 403 outputs a logical conjunction signal of the write enable signal WE_A and the mismatch signal MT as a write enable signal WE1_A. The AND circuit 404 outputs a logical conjunction signal of the write enable signal WE_B and the mismatch signal MT as a write enable signal WE1_B. The AND circuit 405 outputs a logical conjunction signal of the write enable signal WE_C and the mismatch signal MT as a write enable signal WE1_C.

The matching detecting unit 402 and the AND circuits 403 to 405 are a write disabling unit. When at least two write addresses of a plurality of write addresses for which write enable signals are enabled and held by the latch unit 401 match, the matching detecting unit 402 and the AND circuits 403 to 405 disable write enable signals and output the disabled signals. When at least two write addresses of a plurality of write addresses for which write enable signals are enabled and held by the latch unit 401 do not match, the matching detecting unit 402 and the AND circuits 403 to 405 output write enable signals without change.

The latch unit 501 is a holding unit that holds sets of the plurality of write addresses WA_A to WA_C held by the latch unit 401 and the plurality of write enable signals WE1_A to WE1_C output by the AND circuits 403 to 405 and outputs sets of the plurality of write addresses WA2_A to WA2_C and the plurality of write enable signals WE2_A to WE2_C.

The write disabling unit 600 includes inverters 601 to 604, AND circuits 605 to 607, logical disjunction (OR) circuits 608 to 610, and AND circuits 611 to 613. The inverter 601 outputs data obtained by logically inverting mask data TMWM [1]. The inverter 603 outputs data obtained by logically inverting the output data of the inverter 601. The inverter 602 outputs data obtained by logically inverting mask data TMWM [0]. The inverter 604 outputs data obtained by logically inverting the output data of the inverter 602. The AND circuit 605 outputs logical conjunction data of the output data of the inverters 601 and 602. The AND circuit 606 outputs conjunction data of the output data of the inverters 601 and 604. The AND circuit 607 outputs logical conjunction data of the output data of the inverters 602 and 603. The OR circuit 608 outputs logical disjunction data of the output data of the AND circuit 605 and a mode signal TM. The OR circuit 609 outputs logical disjunction data of the output data of the AND circuit 606 and the mode signal TM. The OR circuit 610 outputs logical disjunction data of the output data of the AND circuit 607 and the mode signal TM. The AND circuit 611 outputs a logical conjunction signal of the output data of the OR circuit 608 and the write enable signal WE2_A as a write enable signal WE3_A. The AND circuit 612 outputs a logical conjunction signal of the output data of the OR circuit 609 and the write enable signal WE2_B as a write enable signal WE3_B. The AND circuit 613 outputs a logical conjunction signal of the output data of the OR circuit 610 and the write enable signal WE2_C as a write enable signal WE3_C.

In the normal mode, the mode signal TM is at the high level. In this case, the outputs of the OR circuits 608 to 610 are at the high level. The AND circuit 611 outputs the write enable signal WE2_A as the write enable signal WE3_A. The AND circuit 612 outputs the write enable signal WE2_B as the write enable signal WE3_B. The AND circuit 613 outputs the write enable signal WE2_C as the write enable signal WE3_C.

Similarly to the case of FIG. 2, the decoder 201 outputs, based on the write enable signals WE3_A to WE3_C and the write addresses WA2_A to WA2_C, the write enable signals WEA1 to WEAm, WEB1 to WEBm, and WEC1 to WECm. Similarly to the case of FIG. 2, the holding unit 202 writes, based on the write enable signals WEA 1 to WEAm, WEB 1 to WEBm, and WEC 1 to WECm, write data. The reading unit 203 reads, based on the read addresses RA0 to RA5, the data RD0 to RD5. The read latch unit 204 holds the data RD0 to RD5.

Next, the test mode will be described. In the test mode, in order to perform the scan test, by turning on the transfer gates 701 and 702 (see FIG. 7), the latch unit 401, the latch unit 501, the latch unit 614, and the latch unit of the holding unit 202 are mutually connected. By inputting test data to the scan input terminal SI of the latch unit 401 and causing the latch unit 401, the latch unit 501, the latch unit 614, and the latch unit of the holding unit 202 to perform a shift operation, the test data is written in the latch unit 401, the latch unit 501, the latch unit 614, and the latch unit of the holding unit 202. The latch unit 401 outputs the held test data as the write enable signals WE_A to WE_C and the write addresses WA_A to WA_C. The latch unit 501 outputs the held test data as the write enable signals WE2_A to WE2_C and the write addresses WA2_A to WA2_C. The latch unit 614 is a holding unit that holds and outputs test data as mask data TMWM [0] and TMWM [1]. The holding unit 202 outputs the held test data.

Next, the register file device 100C turns off the transfer gates 701 and 702 (see FIG. 7), and performs one cycle of operation based on the test data. The latch unit 501 holds the write enable signals WE1_A to WE1_C and the write addresses WA_A to WA_C. The holding unit 202 writes, based on the write enable signals WEA1 to WEAm, WEB1 to WEBm, and WEC1 to WECm, the write data and holds the write data.

Next, by causing the latch unit 401, the latch unit 501, the latch unit 614, and the latch unit of the holding unit 202 to perform a shift operation, the data of the latch unit 401, the latch unit 501, the latch unit 614, and the latch unit of the holding unit 202 is read from the scan output terminal SO of the holding unit 202. By comparing the read data with an expected value, it is possible to determine the test result of the register file device 100C.

FIG. 8 is a diagram illustrating a truth table of input/output of the write disabling unit 600 in FIG. 6. The value "1" indicates the high level, and the value "0" indicates the low level. In the normal mode, the mode signal TM is at 1. When the mode signal TM is at 1, the write enable signal WE3_A becomes the same signal as the write enable signal WE2_A irrespective of the mask data TMWM [0] and TMWM [1]. The write enable signal WE3_B becomes the same signal as the write enable signal WE2_B. The write enable signal WE3_C becomes the same signal as the write enable signal WE2_C.

In the test mode, the mode signal TM is at 0. A case where the mode signal TM is at 0, the mask data TMWM [1] is at 0, and the mask data TMWM [0] is at 0 will be described. In that case, the write enable signal WE3_A becomes the same signal as the write enable signal WE2_A. The write enable signal WE3_B becomes at 0. The write enable signal WE3_C becomes at 0.

Next, a case where the mode signal TM is at 0, the mask data TMWM [1] is at 0, and the mask data TMWM [0] is at 1 will be described. In that case, the write enable signal WE3_A becomes at 0. The write enable signal WE3_B becomes the same signal as the write enable signal WE2_B. The write enable signal WE3_C becomes at 0.

Next, a case where the mode signal TM is at 0, the mask data TMWM [1] is at 1, and the mask data TMWM [0] is at 0 will be described. In that case, the write enable signal WE3_A becomes at 0. The write enable signal WE3_B becomes at 0. The write enable signal WE3_C becomes the same signal as the write enable signal WE2_C.

Next, a case where the mode signal TM is at 0, the mask data TMWM [1] is at 1, and the mask data TMWM [0] is at 1 will be described. In that case, the write enable signal WE3_A becomes at 0. The write enable signal WE3_B becomes at 0. The write enable signal WE3_C becomes at 0.

As described above, in the test mode (TM=0), in accordance with the mask data TMWM [0] and TMWM [1], the write disabling unit 600 outputs one write enable signal of the plurality of write enable signals WE2_A to WE2_C held by the latch unit 501 without change and causes the other write enable signals to be at 0 to output the other write enable signals (in the disabled state), or causes all the write enable signals to be at 0 to output all the write enable signals (in the disabled state). In the normal mode (TM=1), the write disabling unit 600 outputs the plurality of write enable signals WE2_A to WE2_C held by the latch unit 501 without change.

When the mode signal TM is at 1, the matching detecting unit 402 and the AND circuits 403 to 405 in FIG. 6 can prevent a bus fight in which two or more of the plurality of write enable signals become at 1. Also, when the mode signal TM is 0, the write disabling unit 600 can prevent a bus fight in which two or more of the plurality of write enable signals become at 1. Thereby, not only in a normal mode but also in a test mode, it is possible to prohibit a bus fight of writing different data to a same address.

In the test mode, by using mask data TMWM [0] and TMWM [1], it is possible to generate test data of write enable signals WE3_A to WE3_C of various patterns.

Figure 9:
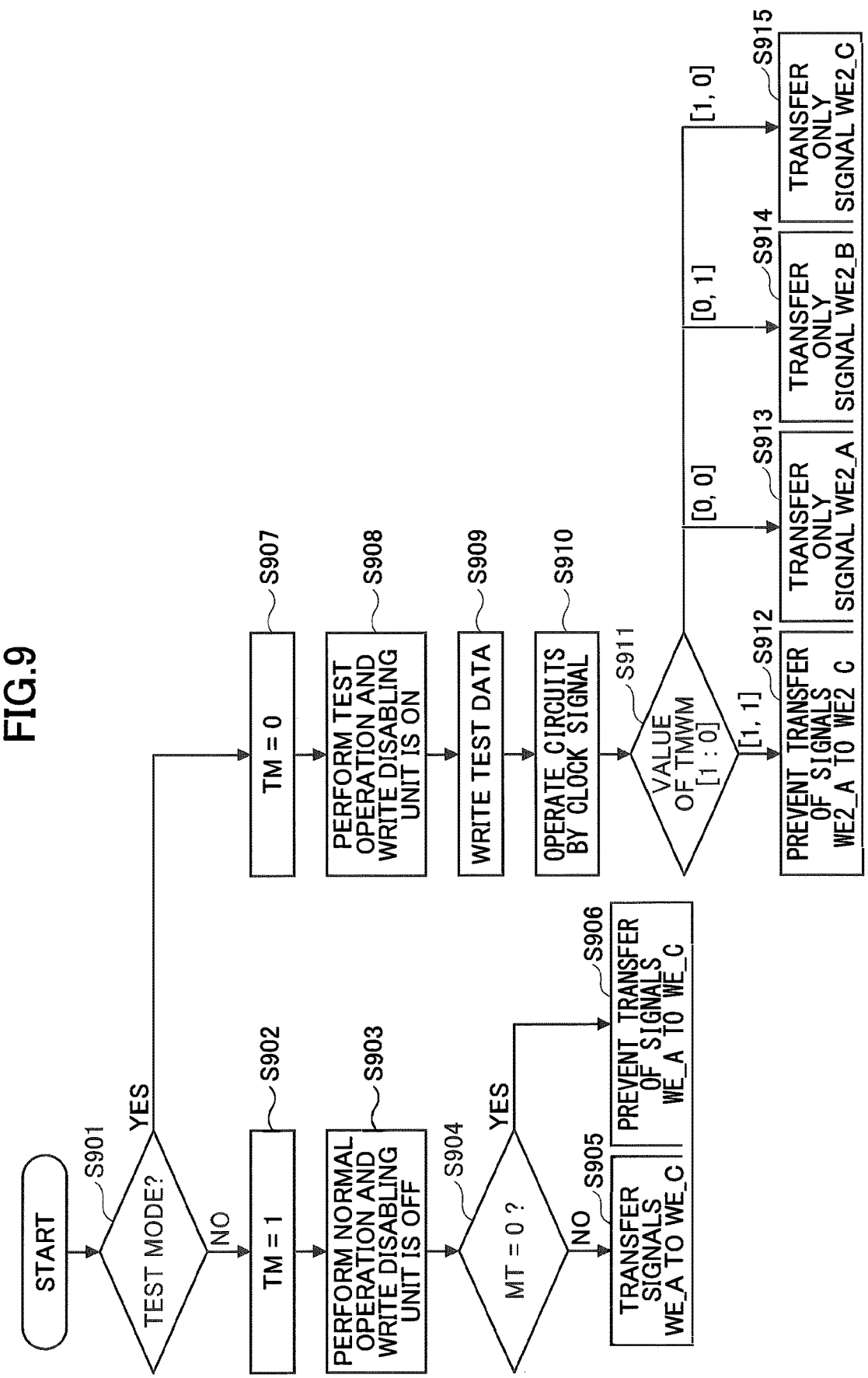
FIG. 9 is a flowchart illustrating a method for controlling the register file device according to the first embodiment.

FIG. 9 is a flowchart illustrating a method for controlling the register file device 100C according to the present embodiment. In step S901, the register file device 100C determines whether the operation mode is the test mode or the normal mode. When determining that the operation mode is the normal mode, the register file device 100C advances the process to step S902. When determining that the operation mode is the test mode, the register file device 100C advances the process to step S907.

In step S902, the register file device 100C sets the mode signal TM to be at 1. Next, in step S903, the register file device 100C performs a normal operation. Because the mode signal TM is at 1, the write disabling unit 600 is turned off. Next, in step S904, the register file device 100C determines whether the mismatch signal MT is at 0 (low level). When the mismatch signal MT is at 0, because a bus fight occurs, the register file device 100C advances the process to step S906. When the mismatch signal MT is at 1, because a bus fight does not occur, the register file device 100C advances the process to step S905.

In step S905, because no bus fight occurs, the AND circuits 403 to 405 output the write enable signals WE_A to WE_C as the write enable signals WE1_A to WE1_C. The write disabling unit 600 outputs the write enable signals WE2_A to WE2_C as the write enable signals WE3_A to WE3_C.

In step S906, the AND circuits 403 to 405 respectively output the write enable signals WE1_A to WE1_C at 0. Thereby, a bus fight can be prevented.

In step S907, the register file device 100C sets the mode signal TM to be at 0. Next, in step S908, the register file device 100C performs a scan test operation. Because the mode signal TM is at 0, the write disabling unit 600 is turned on. Next, in step S909, the register file device 100C writes test data in the latch unit 401, the latch unit 501, the latch unit 614, and the latch unit of the holding unit 202 via the scan paths 615 to 617. Next, in step S910, the register file device 100C operates circuits by the clock signal CK. Next, in step S911, the register file device 100C determines the values of the mask data TMWM [0] and TMWM [1].

When the mask data TMWM [1] is at 1 and the mask data TMWM [0] is at 1, the register file device 100C advances the process to step S912. In step S912, the write disabling unit 600 outputs each of the write enable signals WE3_A to WE3_C at 0. Thereby, a bus fight can be prevented.

When the mask data TMWM [1] is at 0 and the mask data TMWM [0] is at 0, the register file device 100C advances the process to step S913. In step S913, the write disabling unit 600 outputs only the write enable signal WE2_A as the write enable signal WE3_A. Thereby, a bus fight can be prevented.

Also, when the mask data TMWM [1] is at 0 and the mask data TMWM [0] is at 1, the register file device 100C advances the process to step S914. In step S914, the write disabling unit 600 outputs only the write enable signal WE2_B as the write enable signal WE3_B. Thereby, a bus fight can be prevented.

Also, when the mask data TMWM [1] is at 1 and the mask data TMWM [0] is at 0, the register file device 100C advances the process to step S915. In step S915, the write disabling unit 600 outputs only the write enable signal WE2_C as the write enable signal WE3_C. Thereby, a bus fight can be prevented.

Figure 10:
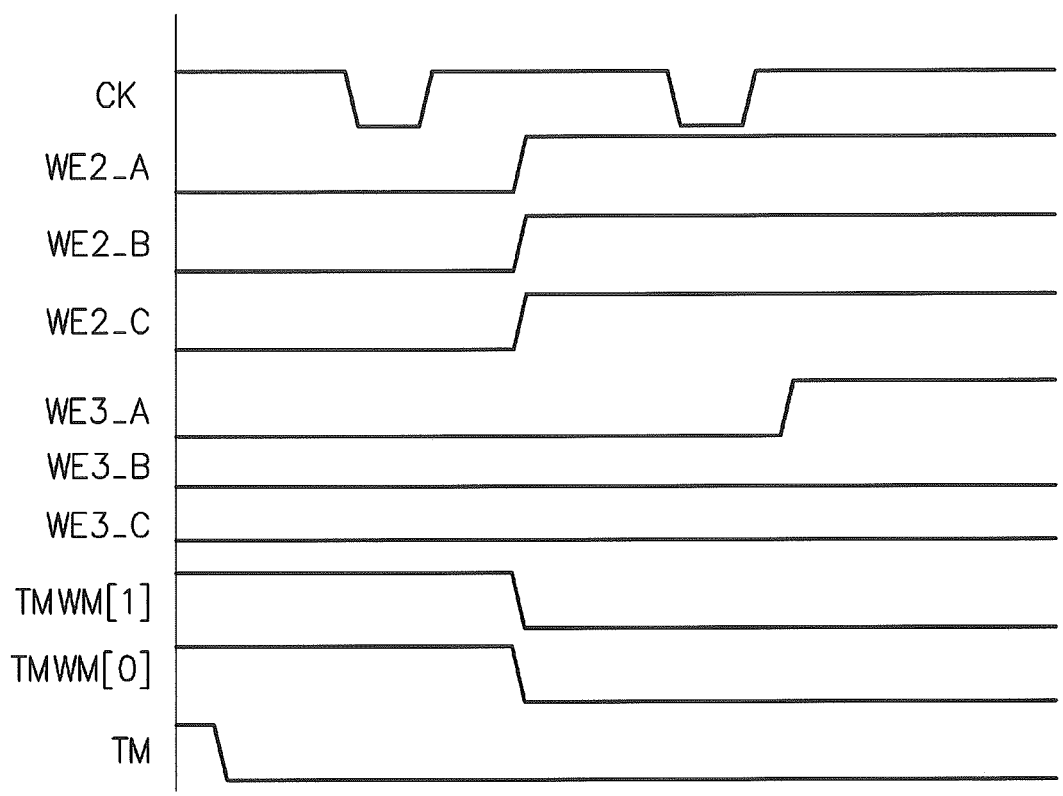
FIG. 10 is a timing chart illustrating the method for controlling the register file device according to the first embodiment.

FIG. 10 is a timing chart illustrating the method for controlling the register file device 100C according to the present embodiment. In a case of the normal mode, the mode signal TM becomes at the high level. In this case, the write disabling unit 600 outputs the write enable signals WE2_A to WE2_C as the write enable signals WE3_A to WE3_C. In this case, the matching detecting unit 402 and the AND circuits 403 to 405 can prevent a bus fight.

Next, in a case of the test mode, the mode signal TM becomes at the low level. To the latch unit 501, the write enable signals WE2_A to WE2_C each of which is at the low level are written. To the latch unit 614, the mask data TMWM [0] and the mask data TMWM [1] each of which is at the high level are written. Upon the clock signal CK becoming at a negative pulse, the circuits of the register file device 100C operate. The write disabling unit 600 outputs the write enable signals WE3_A to WE3_C each of which is at the low level.

Next, to the latch unit 501, the write enable signals WE2_A to WE2_C each of which is at the high level are written. To the latch unit 614, the mask data TMWM [0] and the mask data TMWM [1] each of which is at the low level are written. Upon the clock signal CK becoming at a negative pulse, the circuits of the register file device 100C operate. The write disabling unit 600 outputs the write enable signal WE3_A at the high level and the write enable signals WE3_B and WE3_C each of which is at the low level. Thereby, a bus fight can be prevented.

Note that the scan output terminal SO of the latch unit 501 may be connected to the scan input terminal SI of the holding unit 202 via the scan path 617. In the test mode, the holding unit 202 is connected to the latch unit 501 via the scan path 617.

Second Embodiment

Figure 11:
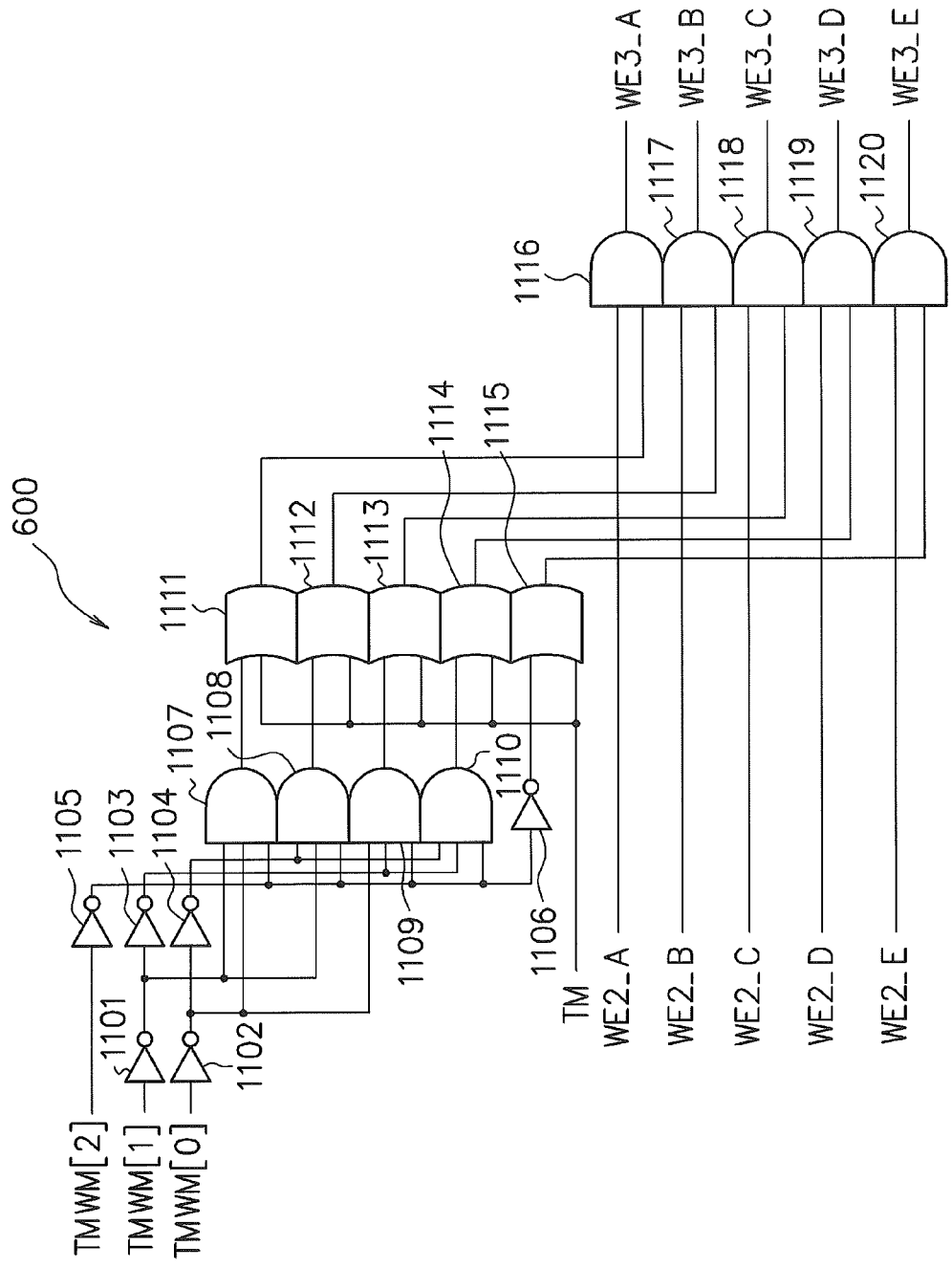
FIG. 11 is a diagram illustrating a configuration example of a write disabling unit according to a second embodiment.

FIG. 11 is a diagram illustrating a configuration example of the write disabling unit 600 according to a second embodiment. In the first embodiment, three sets of write enable signals and write addresses have been described as an example. In the second embodiment, five sets of write enable signals and write addresses will be described as an example. The write disabling unit 600 in FIG. 11 is provided in place of the write disabling unit 600 in FIG. 6. In the following, differences between the second embodiment and the first embodiment will be described.

In FIG. 6, the latch unit 401 outputs five sets of write enable signals WE_A to WE_E and write addresses WA_A to WA_E. The latch unit 501 receives the five sets of the write enable signals WE1_A to WE1_E and the write addresses WA_A to WA_E, and outputs five sets of write enable signals WE2_A to WE2_E and write addresses WA2_A to WA2_E. The latch unit 614 outputs 3-bit mask data TMWM [0] to TMWM [2]. The decoder 201 receives five sets of write enable signals WE3_A to WE3_E and write addresses WA2_A to WA2_E and outputs write enable signals WEA1 to WEAm, WEB1 to WEBm, WEC1 to WECm, WED1 to WEDm, and WEE1 to WEEm.

In FIG. 11, the write disabling unit 600 includes inverters 1101 to 1106, AND circuits 1107 to 1110, OR circuits 1111 to 1115, and AND circuits 1116 to 1120. The inverter 1101 outputs data obtained by logically inverting the mask data TMWM [1]. The inverter 1102 outputs data obtained by logically inverting the mask data TMWM [0]. The inverter 1103 outputs data obtained by logically inverting the output data of the inverter 1101. The inverter 1104 outputs data obtained by logically inverting the output data of the inverter 1102. The inverter 1105 outputs data obtained by logically inverting the mask data TMWM [2]. The inverter 1106 outputs data obtained by logically inverting the output data of the inverter 1105.

The AND circuit 1107 outputs logical conjunction data of the output data of the inverters 1101, 1102, and 1105. The AND circuit 1108 outputs logical conjunction data of the output data of the inverters 1101, 1104, and 1105. The AND circuit 1109 outputs logical conjunction data of the output data of the inverters 1102, 1103, and 1105. The AND circuit 1110 outputs logical conjunction data of the output data of the inverters 1103, 1104, and 1105.

The OR circuit 1111 outputs logical disjunction data of the output data of the AND circuit 1107 and the mode signal TM. The OR circuit 1112 outputs logical disjunction data of the output data of the AND circuit 1108 and the mode signal TM. The OR circuit 1113 outputs logical disjunction data of the output data of the AND circuit 1109 and the mode signal TM. The OR circuit 1114 outputs logical disjunction data of the output data of the AND circuit 1110 and the mode signal TM. The OR circuit 1115 outputs logical disjunction data of the output data of the inverter 1106 and the mode signal TM.

The AND circuit 1116 outputs a logical conjunction of the output data of the OR circuit 1111 and the write enable signal WE2_A to the decoder 201 as the write enable signal WE3_A. The AND circuit 1117 outputs a logical conjunction signal of the output data of the OR circuit 1112 and the write enable signal WE2_B to the decoder 201 as the write enable signal WE3_B. The AND circuit 1118 outputs a logical conjunction signal of the output data of the OR circuit 1113 and the write enable signal WE2_C to the decoder 201 as the write enable signal WE3_C. The AND circuit 1119 outputs a logical conjunction signal of the output data of the OR circuit 1114 and the write enable signal WE2_D to the decoder 201 as the write enable signal WE3_D. The AND circuit 1120 outputs a logical conjunction signal of the output data of the OR circuit 1115 and the write enable signal WE2_E to the decoder 201 as the write enable signal WE3_E.

FIG. 12 is a diagram illustrating a truth table of input/output of the write disabling unit 600 in FIG. 11. The value "1" indicates the high level, and the value "0" indicates the low level. In the normal mode, the mode signal TM is at 1. When the mode signal TM is at 1, the write enable signal WE3_A becomes the same signal as the write enable signal WE2_A irrespective of the mask data TMWM [0] to TMWM [2]. The write enable signal WE3_B becomes the same signal as the write enable signal WE2_B. The write enable signal WE3_C becomes the same signal as the write enable signal WE2_C. The write enable signal WE3_D becomes the same signal as the write enable signal WE2_D. The write enable signal WE3_E becomes the same signal as the write enable signal WE2_E.

In the test mode, the mode signal TM is at 0. A case where the mode signal TM is at 0, the mask data TMWM [2] is at 0, the mask data TMWM [1] is at 0, and the mask data TMWM [0] is at 0 will be described. In that case, the write enable signal WE3_A becomes the same signal as the write enable signal WE2_A. The write enable signals WE3_B to WE3_E become at 0.

Next, a case where the mode signal TM is at 0, the mask data TMWM [2] is at 0, the mask data TMWM [1] is at 0, and the mask data TMWM [0] is at 1 will be described. In that case, the write enable signal WE3_B becomes the same signal as the write enable signal WE2_B. The write enable signals WE3_A and WE3_C to WE3_E become at 0.

Next, a case where the mode signal TM is at 0, the mask data TMWM [2] is at 0, the mask data TMWM [1] is at 1, and the mask data TMWM [0] is at 0 will be described. In that case, the write enable signal WE3_C becomes the same signal as the write enable signal WE2_C. The write enable signals WE3_A, WE3_B, WE3_D and WE3_E become at 0.

Next, a case where the mode signal TM is at 0, the mask data TMWM [2] is at 0, the mask data TMWM [1] is at 1, and the mask data TMWM [0] is at 1 will be described. In that case, the write enable signal WE3_D becomes the same signal as the write enable signal WE2_D. The write enable signals WE3_A to WE3_C and WE3_E become at 0.

Next, a case where the mode signal TM is at 0 and the mask data TMWM [2] is at 1 will be described. In that case, irrespective of the mask data TMWM [0] and TMWM [1], the write enable signal WE3_E becomes the same signal as the write enable signal WE2_E. The write enable signals WE3_A to WE3_D become at 0.

As described above, in the test mode (TM=0), in accordance with the mask data TMWM [0] to TMWM [2], the write disabling unit 600 outputs one write enable signal of the plurality of write enable signals WE2_A to WE2_E held by the latch unit 501 without change and causes the other write enable signals to be at 0 to output the other write enable signals (in the disabled state). In the normal mode (TM=1), the write disabling unit 600 outputs the plurality of write enable signals WE2_A to WE2_E held by the latch unit 501 without change. According to the second embodiment, it is possible to prohibit a bus fight not only in a normal mode but also in a test mode, similarly to the first embodiment.

Third Embodiment

Figure 13:
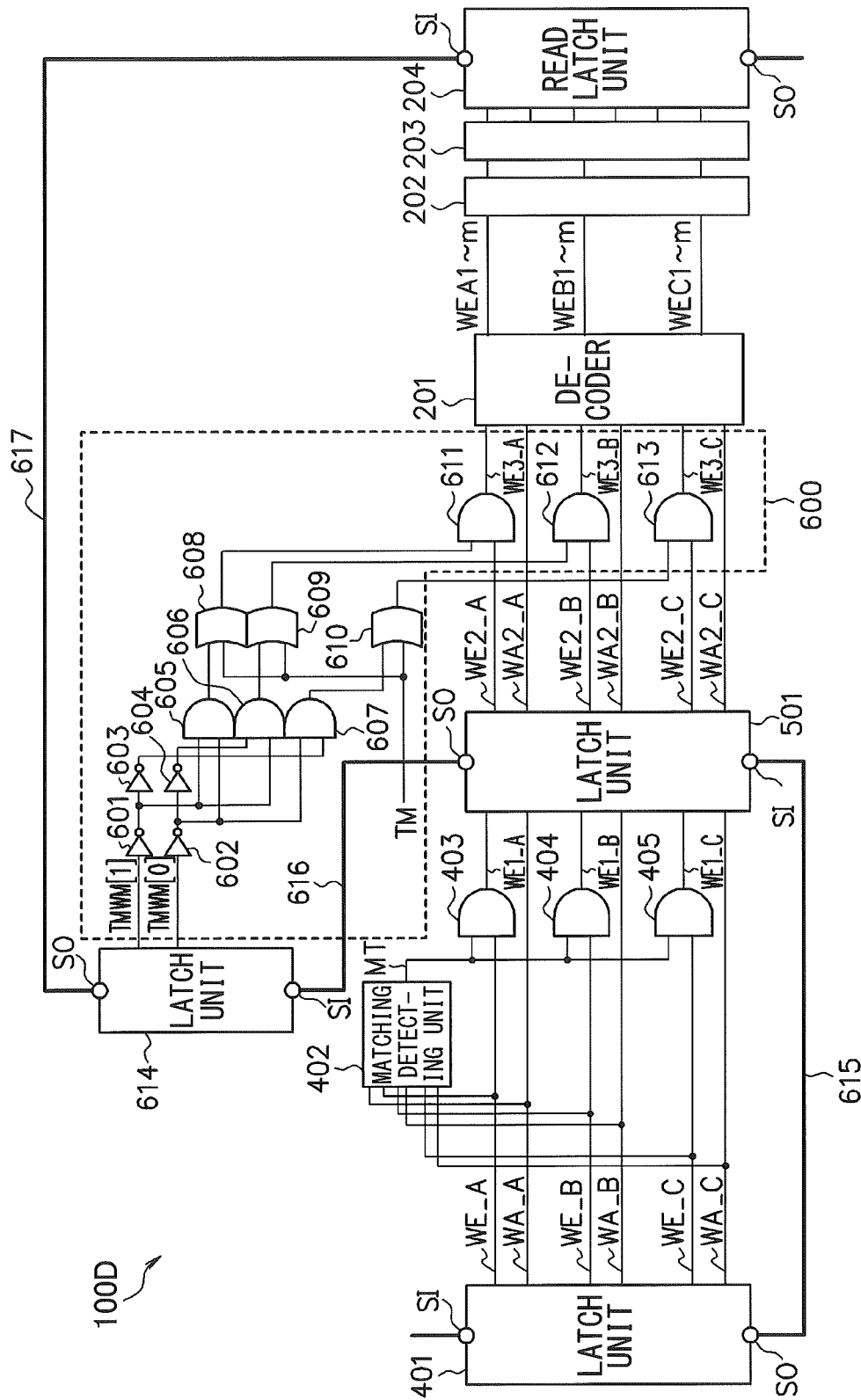
FIG. 13 is a diagram illustrating a configuration example of a register file device according to a third embodiment.

FIG. 13 is a diagram illustrating a configuration example of a register file device 100D according to a third embodiment. In the first embodiment (see FIG. 6), the scan path 617 is connected to the holding unit 202. As illustrated in FIG. 2, the holding unit 202 includes a large number of latch units 221-1 to 22$m$-$n$. For all of the latch units 221-1 to 22$m$-$n$, it is required to add transfer gates 701 and 702 and inverters 703 to 705 as illustrated in FIG. 7 for a scan test. Thus, there is a problem that the area of the register file device 100C increases.

In the third embodiment (see FIG. 13), the scan path 617 is not connected to the holding unit 202 but connected to the read latch unit 204. Therefore, it is possible to omit transfer gates 701, 702 and inverters 703 to 705 as illustrated in FIG. 7 for all of the latch units 221-1 to 22$m$-$n$ in the holding unit 202. Thus, the area of the register file device 100D can be reduced. In the following, differences between the third embodiment and the first embodiment will be described.

The read latch unit 204 has a configuration similar to that of the latch unit of FIG. 7 for the scan test. The scan output terminal SO of the latch unit 614 is connected to the scan input terminal SI of the read latch unit 204 via the scan path 617.

The test mode will be described. In the test mode, in order to perform the scan test, by turning on the transfer gates 701 and 702 (see FIG. 7), the latch unit 401, the latch unit 501, the latch unit 614, and the read latch unit 204 are mutually connected. First, for the scan test of the matching detecting unit 402 and the AND circuits 403 to 405, test data is input to the scan input terminal SI of the latch unit 401 and the test data is written in the latch unit 401. The latch unit 401 outputs the held test data as write enable signals WE_A to WE_C and write addresses WA_A to WA_C.

Next, the register file device 100D turns off the transfer gates 701 and 702 (see FIG. 7), and performs one cycle of operation based on the test data. The latch unit 501 holds the write enable signals WE1_A to WE1_C and the write addresses WA_A to WA_C.

Next, by causing the latch unit 401, the latch unit 501, the latch unit 614, and the read latch unit 204 to perform a shift operation, the data of the latch unit 501 is read out from the scan output terminal SO of the read latch unit 204. By comparing the data of the latch unit 501 with an expected value, it is possible to determine the test result of the matching detecting unit 402 and the AND circuits 403 to 405.

Next, for the scan test of the write disabling unit 600, the decoder 201, the holding unit 202, and the reading unit 203, by inputting test data to the scan input terminal SI of the latch unit 401 and causing the latch unit 401, the latch unit 501, the latch unit 614, and the read latch unit 204 to perform a shift operation, the test data is written in the latch unit 501 and the latch unit 614. The latch unit 501 outputs the held test data as write enable signals WE2_A to WE2_C and write addresses WA2_A to WA2_C. The latch unit 614 outputs the held test data as mask data TMWM [0] and TMWM [1].

Next, the register file device 100D turns off the transfer gates 701 and 702 (see FIG. 7), and performs two cycles of operation based on the test data. In the first cycle, the holding unit 202 holds write data based on the write enable signals WEA1 to WEAm, WEB1 to WEBm, and WEC1 to WECm. In the second cycle, the read latch unit 204 holds the data RD0 to RD5.

Next, the data of the read latch unit 204 is read from the scan output terminal SO of the read latch unit 204. By comparing the data of the read latch unit 204 with an expected value, it is possible to determine the test result of the write disabling unit 600, the decoder 201, the holding unit 202, and the reading unit 203.

Note that the scan output terminal SO of the latch unit 501 may be connected to the scan input terminal SI of the read latch unit 204 via the scan path 617. In the test mode, the read latch unit 204 is connected to the latch unit 501 via the scan path 617.

In the first embodiment, a 3-port register file device 100C is described, and in the third embodiment, a 5-port register file device 100D is described. It is possible to change the number of writing ports. A register file device 100 can prevent a bus fight by changing the circuits of a write disabling unit 600 in accordance with the number of ports. Therefore, irrespective of the number of input ports of the register file device 100, the write disabling unit 600 can prevent a bus fight.

Note that all of the above described embodiments merely represent specific examples in implementing the present invention, and the technical scope of the present invention should not be limited by the above described embodiments. That is, the present invention can be implemented in various forms without departing from its technical concept or its main features.

All examples and conditional language provided herein are intended for pedagogical purposes of aiding the reader in understanding the invention and the concepts contributed by the inventors to further the art, and are not to be construed as limitation to such specifically recited examples and conditions, nor does the organization of such examples in the specification relate to a showing of superiority and inferiority of the invention. Although one or more embodiments of the present invention have been described in detail, it should be understood that various changes, substitutions, and alterations could be made hereto without departing from the spirit and scope of the invention.

What is claimed is:

1. A storage device comprising:
   a first latch circuit configured to hold a plurality of sets of write addresses and write enable signals;
   a first disabling circuit, including inverters, AND circuits, and logical disjunction OR circuits, and configured to output the write enable signals without change when at least two write addresses of a plurality of write addresses for which write enable signals are enabled and held by the first latch circuit do not match;
   a second latch circuit configured to hold sets of the plurality of write addresses held by the first latch circuit and the plurality of write enable signals output by the first disabling circuit;
   a second disabling circuit, including inverters, AND circuits, and logical disjunction OR circuits, and configured to output one write enable signal of the plurality of write enable signals held by the second latch circuit without change and disable other write enable signals of the plurality of write enable signals held by the second latch circuit to output the disabled signals or configured to disable all the write enable signals to output the disabled signals, in accordance with mask data, in a test mode, the second disabling circuit being configured to output the plurality of write enable signals held by the second latch circuit without change in a normal mode; and
   a third latch circuit configured to write, in accordance with sets of the plurality of write addresses held by the second latch circuit and the plurality of write addresses output by the second disabling circuit, write data,
   wherein, in the test mode, the first latch circuit and the second latch circuit are mutually connected and test data is written in the first latch circuit and the second latch circuit.

2. The storage device according to claim 1, wherein the first disabling circuit disables the write enable signals and outputs the disabled signals when at least two write addresses of the plurality of write addresses match.

3. The storage device according to claim 1, further comprising:
   a fourth latch circuit configured to hold the mask data, wherein, in the test mode, the fourth latch circuit is connected to the second latch circuit.

4. The storage device according to claim 3, wherein, in the test mode, the third latch circuit is connected to the fourth latch circuit.

5. The storage device according to claim 3, further comprising:
   a reading unit configured to read, in accordance with a read address, data held by the third latch circuit; and
   a fifth latch circuit configured to hold the data read by the reading unit.

6. The storage device according to claim 5, wherein, in the test mode, the fifth latch circuit is connected to the fourth latch circuit.

7. The storage device according to claim 5, wherein, in the test mode, the fifth latch circuit is connected to the second latch circuit.

8. The storage device according to claim 1, wherein, in the test mode, the third latch circuit is connected to the second latch circuit.

9. An operation processing device comprising:
   a storage unit; and
   an operation unit connected to the storage unit,
   wherein the storage unit includes:
   a first latch circuit configured to hold a plurality of sets of write addresses and write enable signals;
   a first disabling circuit, including inverters, AND circuits, and logical disjunction OR circuits, and configured to output the write enable signals without change when at least two write addresses of a plurality of write addresses for which write enable signals are enabled and held by the first latch circuit do not match;
   a second latch circuit configured to hold sets of the plurality of write addresses held by the first latch circuit and the plurality of write enable signals output by the first disabling circuit;
   a second disabling circuit, including inverters, AND circuits, and logical disjunction OR circuits, and configured to output one write enable signal of the plurality of write enable signals held by the second latch circuit without change and disable other write enable signals of the plurality of write enable signals held by the second latch circuit to output the disabled signals or configured to disable all the write enable signals to output the disabled signals, in accordance with mask data, in a test mode, the second disabling circuit being configured to output the plurality of write enable signals held by the second latch circuit without change in a normal mode; and
   a third latch circuit configured to write, in accordance with sets of the plurality of write addresses held by the second latch circuit and the plurality of write addresses output by the second disabling circuit, write data,
   wherein, in the test mode, the first latch circuit and the second latch circuit are mutually connected and test data is written in the first latch circuit and the second latch circuit.

10. A control method of a storage device, the method comprising:
    holding, by a first latch circuit included in the storage device, a plurality of sets of write addresses and write enable signals;
    outputting, by a first disabling circuit included in the storage device and including inverters, AND circuits, and logical disjunction OR circuits, the write enable signals without change when at least two write addresses of a plurality of write addresses for which write enable signals are enabled and held by the first latch circuit do not match;
    holding, by a second latch circuit included in the storage device, sets of the plurality of write addresses held by the first latch circuit and the plurality of write enable signals output by the first disabling circuit;
    outputting, by a second disabling circuit included in the storage device and including inverters, AND circuits, and logical disjunction OR circuits, one write enable signal of the plurality of write enable signals held by the second latch circuit without change and disabling other write enable signals of the plurality of write enable signals held by the second latch circuit to output the disabled signals or disabling all the write enable signals to output the disabled signals, in accordance with mask data, in a test mode;

outputting, by the second disabling circuit included in the storage device, the plurality of write enable signals held by the second latch circuit without change in a normal mode; and writing, by a third latch circuit included in the storage device, in accordance with sets of the plurality of write addresses held by the second latch circuit and the plurality of write addresses output by the second disabling circuit, write data, wherein, in the test mode, the first latch circuit and the second latch circuit are mutually connected and test data is written in the first latch circuit and the second latch circuit.

* * * * *